United States Patent [19]

Rumreich

[11] Patent Number: 4,775,842

[45] Date of Patent: Oct. 4, 1988

[54] MULTI-OUTPUT FEEDBACK AMPLIFIER

[75] Inventor: Mark F. Rumreich, Indianapolis, Ind.

[73] Assignee: RCA Licensing Corporation, Princeton, N.J.

[21] Appl. No.: 47,958

[22] Filed: May 8, 1987

[51] Int. Cl.[4] ............................................. H03F 1/34
[52] U.S. Cl. .................................. 330/103; 330/148; 330/293
[58] Field of Search ................... 330/51, 98, 103, 148, 330/293; 358/104

[56] References Cited

U.S. PATENT DOCUMENTS 2,886,659  5/1959  Schroeder ........................... 179/171
3,622,904  11/1971  Knight ................................. 330/103

*Primary Examiner*—James B. Mullins
*Attorney, Agent, or Firm*—Paul J. Rasmussen; Peter M. Emanuel; Thomas F. Lenihan

[57] ABSTRACT

A feedback amplifier for providing an amplified signal to first and second utilization networks includes first and second feedback paths. The amplifier output is coupled via a first coupling resistor to a first terminal to which the first utilization network is connected, and via a second coupling resistor to a second terminal to which the second utilization network is subject to being connected. The first feedback path couples the amplifier output to the amplifier input exclusive of the first coupling resistor. The second feedback path couples the amplifier output to the amplifier input and includes the second coupling resistor. The amplifier output signal remains substantially constant in the presence or absence of said second utilization network.

5 Claims, 1 Drawing Sheet

MULTI-OUTPUT FEEDBACK AMPLIFIER

FIELD OF THE INVENTION

This invention relates to an electrical signal feedback amplifier having multiple outputs.

BACKGROUND OF THE INVENTION

Modern electrical signal processing systems such as television receivers may utilize a video amplifier having an output capable of driving a selectively connected external load as well as a permanently connected internal load. This may produce problems due to the fact that the signal level at the output of the amplifier is sensitive to the presence or absence of the external load, and may vary.

One solution to this problem is to connect the external load to the amplifier via a switched jack. When an external load is not connected to the switched jack, a "dummy load" terminating impedance is applied across the output terminals of the jack. When an external load is connected to the switched jack, the dummy terminating impedance is disconnected from across the output terminals of the jack. Thus, the load presented to the amplifier is a constant impedance whether or not the external load is connected. This solution has an important drawback. Specifically, this solution requires the use of a switched output jack, and thus prevents the use of a standardized multiple pin connector such as an EIA connector, which is capable of coupling not only video signals but also additional desired signals.

It is desirable that the amplifier have a very low output impedance, preferably about zero ohms, in order to prevent interaction between the various loads which may be connected to the output of the amplifier. It is well-known that such a low output impedance can be obtained via the use of negative feedback, which generally reduces gain while improving frequency response and reducing output impedance.

An example of a prior solution to the problem of coupling the output of an amplifier to multiple loads is disclosed in U.S. Pat. No. 2,886,659 (Schroeder). Schroeder discloses the use of both negative voltage feedback and positive current controlled feedback in a relatively complex control system including a sensing resistor and a differential amplifier.

SUMMARY OF THE INVENTION

A feedback amplifier in accordance with the principles of the present invention advantageously provides automatic feedback compensation for a change in the number of external load circuits connected to the amplifier output. A disclosed preferred embodiment of the present invention comprises a feedback amplifier for providing an amplified signal to first and second signal utilization networks, the second utilization network subject to being present or absent. The amplifier includes first and second feedback paths. The amplifier output is coupled via a first coupling resistor to a first terminal to which the first utilization network is connected, and via a second coupling resistor to a second terminal to which the second utilization network is subject to being connected. The first feedback path couples the amplifier output to the amplifier input exclusive of the first coupling resistor. The second feedback path couples the amplifier output to the amplifier input and includes the second coupling resistor. The amplifier output signal as applied to the first utilization network remains substantially constant in the presence or absence of said second utilization network.

DETAILED DESCRIPTION OF THE DRAWING

Figure 1:
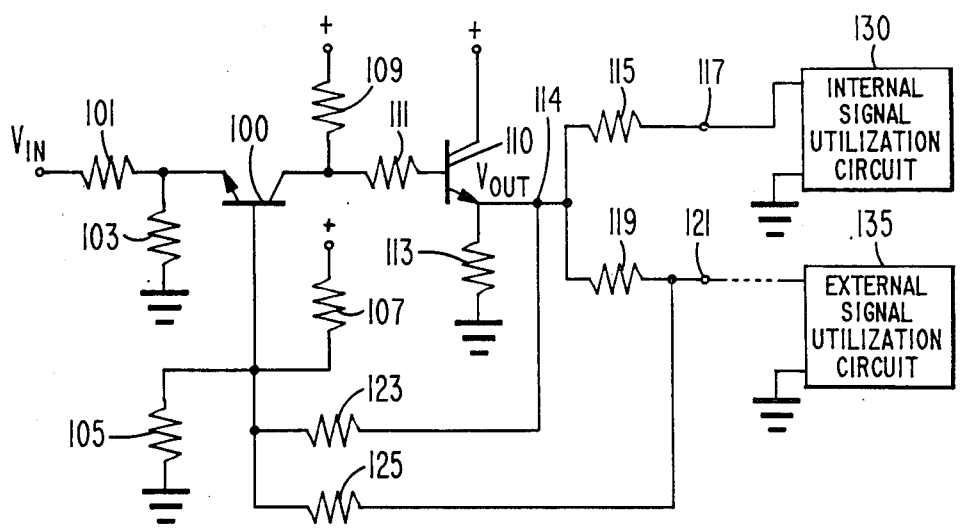
FIG. 1 shows a feedback amplifier in accordance with the present invention.

FIG. 1 illustrates a multi-stage amplifier having a common base transistor input stage and a common collector transistor output stage. In this example the amplifier provides an amplified signal to a continuously connected "internal" first signal utilizing circuit 130, and to an "external" second signal utilizing circuit 135 which may or may not be connected to the output of the amplifier depending upon the requirements of a given system.

An input common base transistor 100 is biased by having its emitter coupled to ground via a resistor 103, its base coupled to ground and to a positive supply voltage (+) by resistors 105 and 107 respectively, and its collector coupled to a source of positive supply voltage (+) via a resistor 109. An amplifier input signal Vin is applied to the emitter of transistor 100 via an input resistor 101, and an output signal of transistor 100 is coupled to the base of output transistor 110 via a resistor 111. The emitter of transistor 110 is coupled to ground through a resistor 113 and the collector of transistor 110 is connected directly to a source of positive supply voltage (+). An amplifier output signal Vout appears at the emitter of transistor 110 and at a node 114. Node 114 is coupled to an "internal" output terminal 117 via 75 ohm coupling resistor 115, and node 114 is coupled to an "external" output terminal 121 via a 75 ohm coupling resistor 119. Coupling resistors 115 and 119 serve as impedance matching resistors which in this eample match an expected 75 ohm input impedance of signal utilization circuits 130 and 135.

Negative feedback is primarily provided by a feedback resistor 123 with a value of approximately 2000 ohms and which is connected between node 114 at the emitter output of transistor 110 and the base of transistor 100. A first feedback signal through resistor 123 establishes the gain of the amplifier, and reduces the amplifier output impedance at node 114 to a low value. Negative feedback is also provided via coupling resistor 119 and a secondary, augmentative negative feedback resistor 125. Resistors 119 and 125 illustratively have values of 75 ohms and 15K ohms, respectively. In this example internal and external signal utilizing circuits 130 and 135 each present a 75 ohm input impedance to respective terminals 117 and 121.

When utilization circuit 135 is not connected to output terminal 121, feedback resistor 125 is in series with coupling resistor 119 and node 114 and thus conveys a portion of Vout at node 114 to the base of transistor 100 as a negative feedback signal in addition to a feedback signal conveyed via resistor 123. Due to the large difference in resistance between the primary feedback path including resistor 123 and the secondary feedback path including resistor 125, the amount of secondary feedback signal is significantly less than the amount of primary feedback signal. However, when utilization circuit 135 is connected to external output terminal 121, a voltage divider is formed by coupling resistor 119 and the load formed by utilization circuit 135. After connection, the signal received by secondary feedback resistor 125 is no longer Vout, but is substantially equal to Vout/2. Thus the feedback signal conducted by secondary feedback resistor 125 is substantially reduced, causing the amplifier gain to increase sufficiently to offset the loading effect caused by the connection of the utilization circuit 135. The result is that the signal level at node 114, and thus also at terminal 117, remains substantially constant with or without an external load connected to external output terminal 121. The amount of secondary feedback is related to the value of resistor 125, which is selected so that the amplitude of the signal at node 114 is substantially the same with and without an external load connected to terminal 121. If too much secondary feedback is present, for example, (too small a value of resistor 125), the signal amplitude at node 114 will increase when the external load is connected and the output impedance at node 121 will be lower than the desired 75 ohms.

Figure 2:
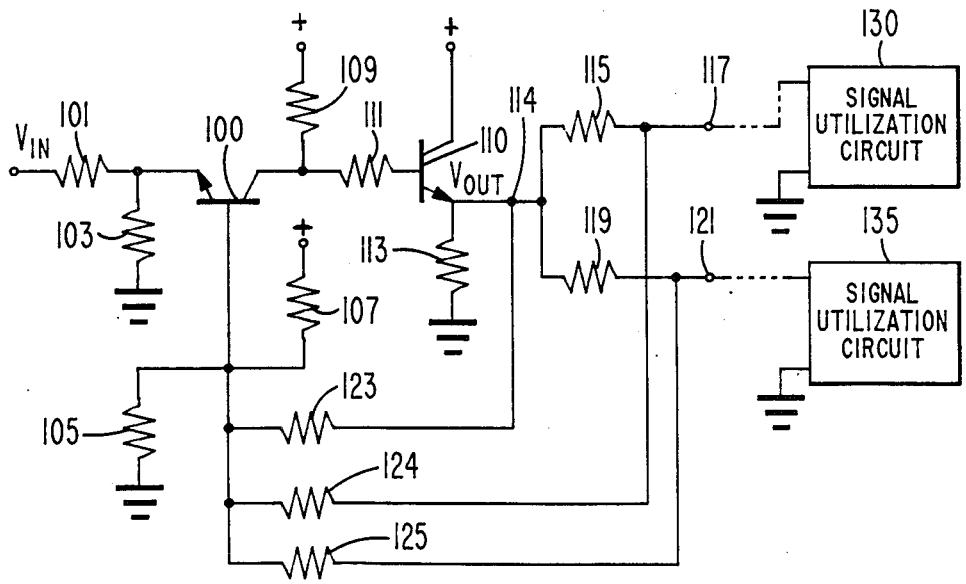
FIG. 2 shows an alternative feedback amplifier in accordance with the present invention.

FIG. 2 is identical to FIG. 1, except that a further feedback resistor 124 is coupled from terminal 117 to the base of transistor 100, and in that signal utilization circuit 130 (in addition to circuit 135) is subject to being connected to or disconnected from terminal 117, as indicated by the dotted line connecting terminal 117 to the input of utilization circuit 130. An amplifier in accordance with the present invention may operate in conjunction with a plurality of signal utilization circuits all of which are subject to connection to and disconnection from the amplifier, and include associated feedback paths including an output impedance matching resistor and a feedback resistor (e.g., resistors 115 and 124 and resistors 119 and 125).

What is claimed is:

1. In an electrical signal amplifier arrangement including an amplifier means having an input for receiving a signal to be amplified, and an output for providing an amplified signal; and a first output terminal and a second output terminal to which loads may be connected and to which said amplified signal is simultaneously coupled, apparatus comprising:
    a first resistance element for coupling said amplified signal from said amplifier output to said first output terminal and for determining the output impedance at said first output terminal;
    a second resistance element for coupling said amplified signal from said amplifier output to said second output terminal and for determining the output impedance at said second output terminal;
    a first feedback path, exclusive of said first resistance element, for coupling said amplifier output to said amplifier input; and
    a second feedback path, inclusive of said second resistance element, for coupling said amplifier output to said amplifier input.

2. The amplifier of claim 1, wherein:
    said first feedback path comprises a third resistance element; and
    said second feedback path comprises a fourth resistive element in addition to said second resistance element.

3. The amplifier of claim 2, wherein
    the value of said fourth resistance element is selected so that the amplitude of said amplified signal provided at said amplifier output remains substantially constant whether or not said load is connected to said second output terminal.

4. The amplifier of claim 1, wherein
    said first feedback path provides a feedback signal substantially greater than a feedback signal provided by said second feedback path.

5. In an electrical signal amplifier arrangement including an amplifier means having an input for receiving a signal to be amplified, and an output for providing an amplified signal; and a first output terminal and a second output terminal to which loads may be connected and to which said amplified signal is simultaneously coupled, apparatus comprising:
    a first resistance element for coupling said amplified signal from said amplifier output to said first output terminal, and for determining the output impedance at said first output terminal;
    second resistance element for coupling said amplified signal from said amplifier output to said second output terminal, and for determining the output impedance at said second output terminal;
    a first feedback path, exclusive of said first resistance element, for coupling said amplifier output to said amplifier input; and
    a second feedback path, inclusive of said second resistance element, for coupling said amplifier output to said amplifier input; and
    a third feedback path, inclusive of said first resistance element, for coupling said amplifier output to said amplifier input.

* * * * *